US008247889B2

(12) United States Patent
Liao et al.

(10) Patent No.: US 8,247,889 B2
(45) Date of Patent: Aug. 21, 2012

(54) PACKAGE HAVING AN INNER SHIELD AND METHOD FOR MAKING THE SAME

(75) Inventors: Kuo-Hsien Liao, Kaohsiung (TW); Jian-Cheng Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 76 days.

(21) Appl. No.: 12/856,389

(22) Filed: Aug. 13, 2010

(65) Prior Publication Data
US 2011/0090659 A1 Apr. 21, 2011

(30) Foreign Application Priority Data

Oct. 16, 2009 (TW) .............................. 98135147 A

(51) Int. Cl.
*H01L 23/552* (2006.01)
*H01L 23/58* (2006.01)
(52) U.S. Cl. ........ 257/659; 257/660; 257/665; 257/704; 257/E23.114; 257/E23.181
(58) Field of Classification Search .................. 257/659, 257/660, 665, 704, 737, E23.114, E23.181
See application file for complete search history.

(56) References Cited

U.S. PATENT DOCUMENTS

| | | | | |
|---|---|---|---|---|
| 5,639,989 | A * | 6/1997 | Higgins, III ................... | 174/386 |
| 7,049,628 | B2 | 5/2006 | Schmid et al. | |
| 7,049,682 | B1 * | 5/2006 | Mathews et al. .............. | 257/660 |
| 7,432,586 | B2 * | 10/2008 | Zhao et al. ..................... | 257/685 |
| 7,629,674 | B1 * | 12/2009 | Foster ............................ | 257/659 |
| 7,851,894 | B1 * | 12/2010 | Scanlan ......................... | 257/659 |
| 7,945,231 | B2 * | 5/2011 | Hoegerl et al. ............... | 455/333 |
| 8,018,034 | B2 * | 9/2011 | Chi et al. ...................... | 257/660 |
| 2006/0267159 | A1 | 11/2006 | Yamamoto et al. | |
| 2009/0025211 | A1 | 1/2009 | Hiner et al. | |
| 2009/0075428 | A1 | 3/2009 | Tang et al. | |
| 2009/0152688 | A1 * | 6/2009 | Do et al. ........................ | 257/659 |
| 2009/0315156 | A1 * | 12/2009 | Harper .......................... | 257/660 |
| 2010/0152688 | A1 * | 6/2010 | Handwerker et al. ......... | 604/361 |
| 2010/0207258 | A1 * | 8/2010 | Eun et al. ...................... | 257/660 |
| 2011/0006408 | A1 * | 1/2011 | Liao .............................. | 257/660 |

FOREIGN PATENT DOCUMENTS

CN 00101401206 4/2009
JP 20040172176 6/2004

OTHER PUBLICATIONS

SIPO Office Action dated Mar. 12, 2012, for the counterpart CN Patent Application No. 200910211804.5, 8 pgs.

* cited by examiner

*Primary Examiner* — Nitin Parekh
(74) *Attorney, Agent, or Firm* — McCracken & Frank LLC

(57) ABSTRACT

The present invention relates to a package having an inner shield and a method for making the same. The package includes a substrate, a plurality of electrical elements, a molding compound, an inner shield and a conformal shield. The electrical elements are disposed on the substrate. The molding compound is disposed on a surface of the substrate, encapsulates the electrical elements, and includes at least one groove. The groove penetrates a top surface and a bottom surface of the molding compound and is disposed between the electrical elements, and there is a gap between a short side of the groove and a side surface of the molding compound. The inner shield is disposed in the groove and electrically connected to the substrate. The conformal shield covers the molding compound and a side surface of the substrate, and electrically connects the substrate and the inner shield. Therefore, the inner shield enables the electrical elements to have low electromagnetic interference and high electromagnetic compatibility.

10 Claims, 15 Drawing Sheets

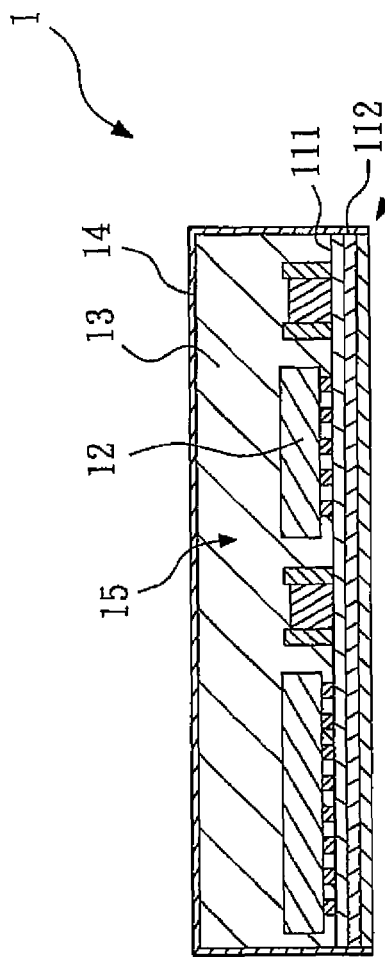
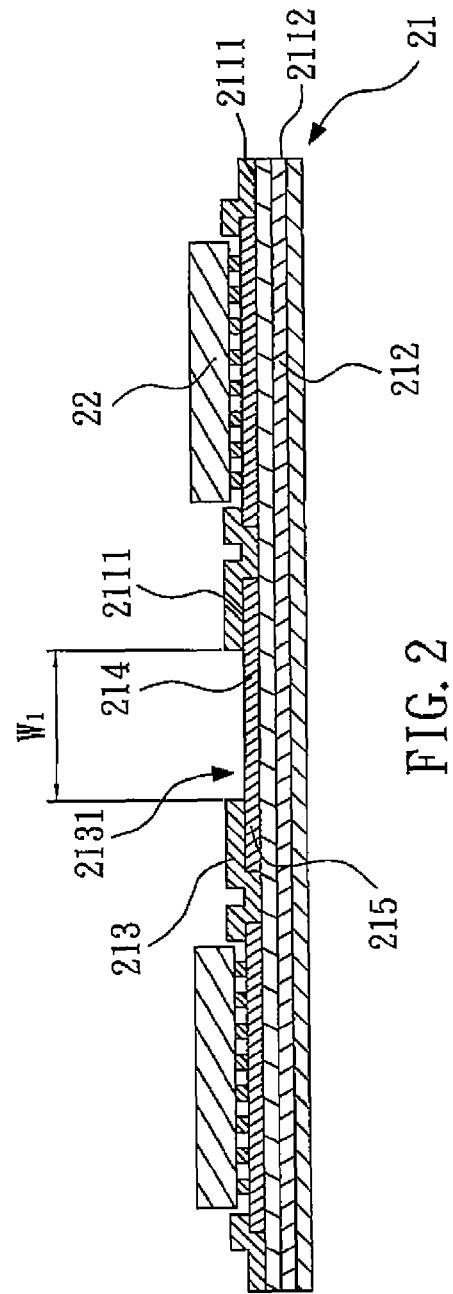
FIG. 1 (Prior Art)
FIG. 2

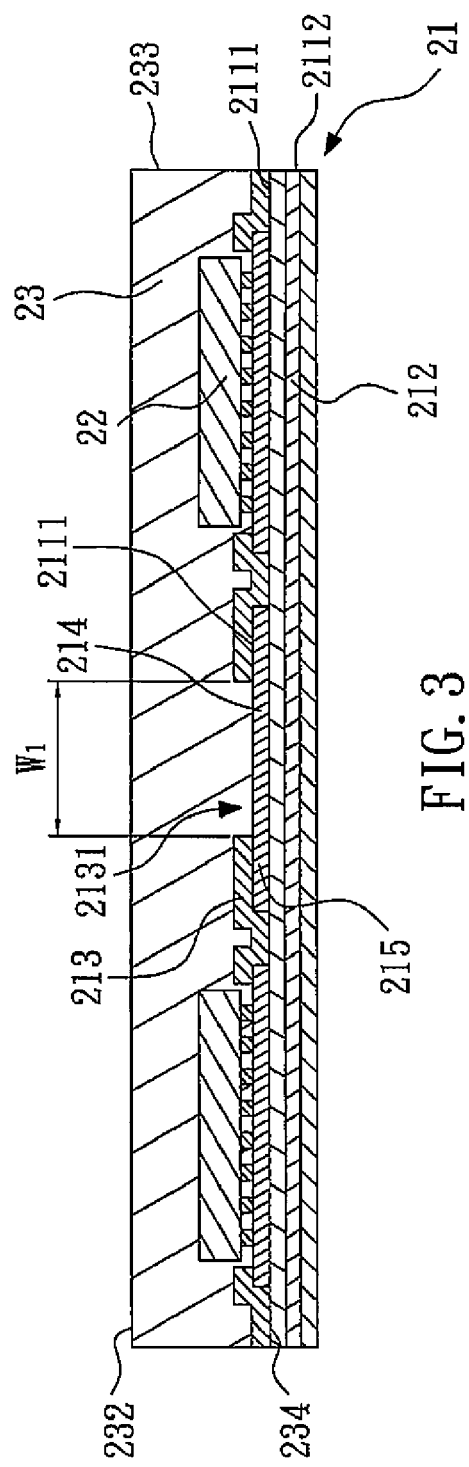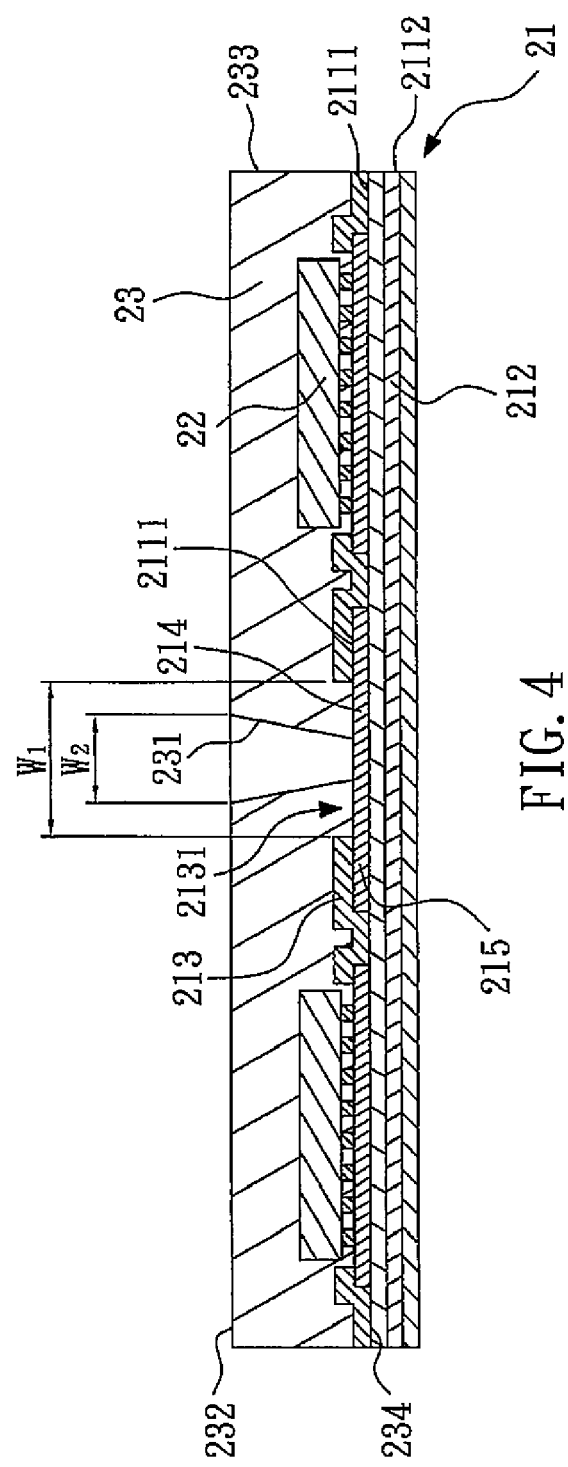

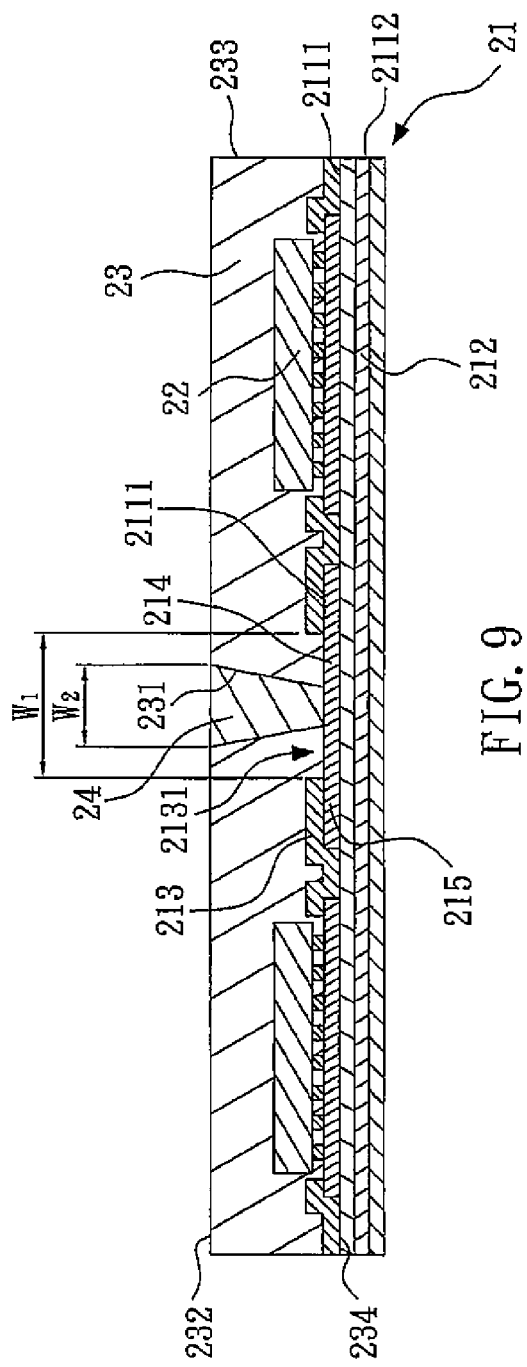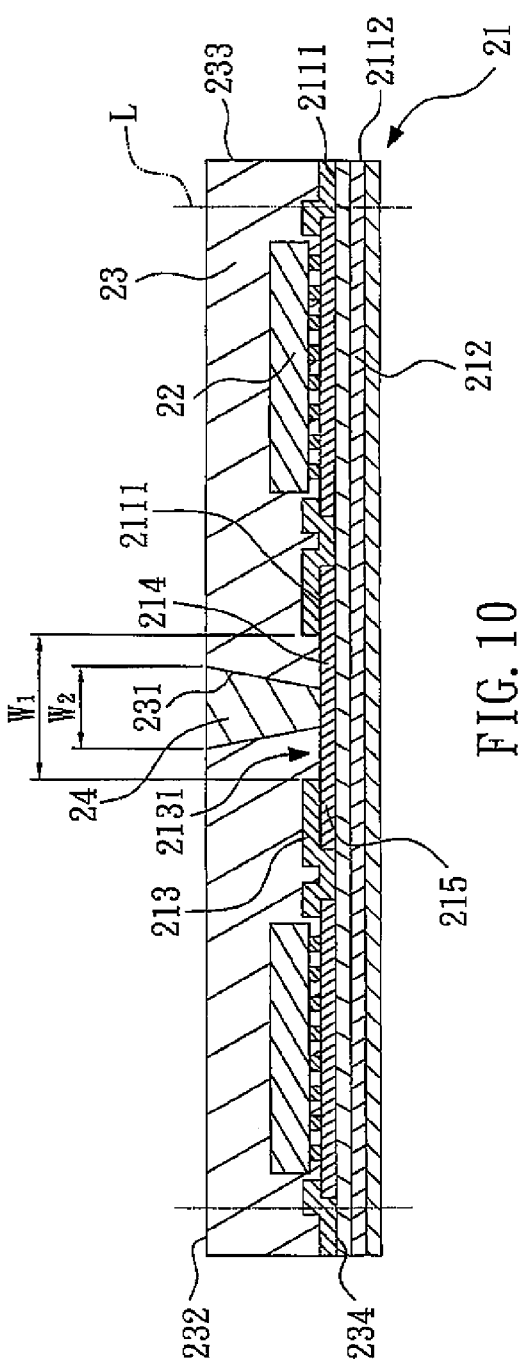

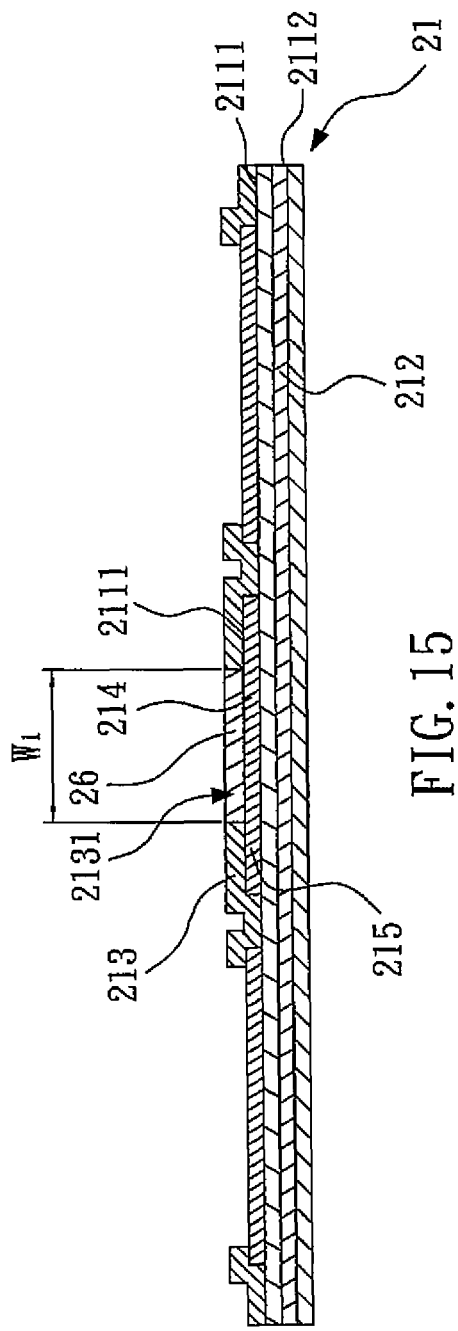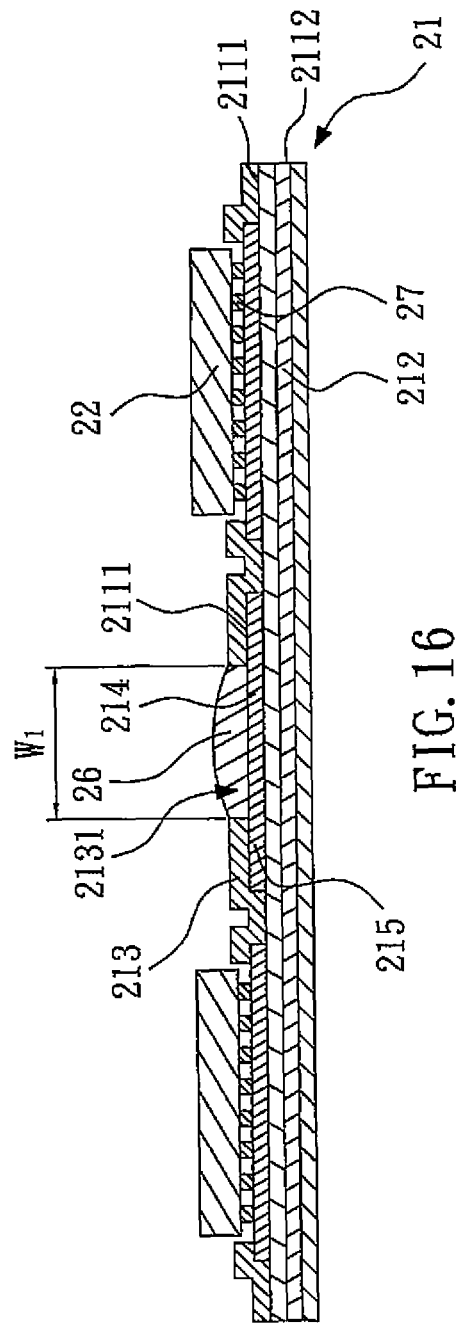

PACKAGE HAVING AN INNER SHIELD AND METHOD FOR MAKING THE SAME

BACKGROUND OF THE INVENTION

1. Field of the Invention

The present invention relates to a package and method for making the same, and more particularly to a package having an inner shield and method for making the same.

2. Description of the Related Art

FIG. 1 shows a cross-sectional view of a conventional package. The conventional package 1 includes a substrate 11, a plurality of electrical elements 12, a molding compound 13 and a conformal shield 14. The electrical elements 12 are disposed on the substrate 11. The molding compound 13 encapsulates a surface of the substrate 11 and the electrical elements 12. The conformal shield 14 covers the molding compound 13 and a side surface of the substrate 11, and is electrically connected to the substrate 11.

The conventional package 1 has the following defects. The substrate 11 and the conformal shield 14 define an accommodating space 15 in which the electrical elements 12 are disposed without any shield between the electrical elements 12, creating high electromagnetic interference and low electromagnetic compatibility between the electrical elements 12.

Therefore, it is necessary to provide a package having an inner shield and method for making the same to solve the above problems.

SUMMARY OF THE INVENTION

The present invention is directed to a package having an inner shield. The package includes a substrate, a plurality of electrical elements, a molding compound, an inner shield and a conformal shield. The substrate has a first surface and a side surface, and includes a grounding metal layer and at least one grounding solder pad. The grounding metal layer is disposed in the substrate and exposed on the side surface of the substrate. The grounding solder pad is disposed in the substrate and exposed on the first surface of the substrate, and electrically connected to the grounding metal layer. The electrical elements are disposed on the first surface of the substrate. The molding compound is disposed on the first surface of the substrate and encapsulates the electrical elements. The molding compound includes at least one groove, a top surface, a bottom surface and a side surface. The groove penetrates the top surface and the bottom surface of the molding compound and is disposed between the electrical elements. The groove has a long side and a short side, and there is a gap between the short side of the groove and the side surface of the molding compound. The inner shield is disposed in the groove, and electrically connected to the grounding solder pad. The conformal shield covers the molding compound and the side surface of the substrate, and is electrically connected to the grounding metal layer and the inner shield.

The present invention is further directed to a package having an inner shield. The package includes a substrate, a plurality of electrical elements, a molding compound, an inner shield and a conformal shield. The substrate has a first surface and a side surface, and includes a grounding metal layer and at least one grounding solder pad. The grounding metal layer is disposed in the substrate and exposed on the side surface of the substrate. The grounding solder pad is disposed in the substrate and exposed on the first surface of the substrate, and electrically connected to the grounding metal layer. The electrical elements are disposed on the first surface of the substrate. The molding compound is disposed on the first surface of the substrate and encapsulates the electrical elements. The molding compound includes at least one groove, a top surface, a bottom surface and a side surface. The groove penetrates the top surface and the bottom surface of the molding compound and is disposed between the electrical elements. The inner shield is disposed in the groove, and electrically connected to the grounding solder pad. The conformal shield covers the molding compound and the side surface of the substrate, and is electrically connected to the grounding metal layer and the inner shield. The ratio of the thickness of the inner shield to the thickness of the conformal shield is greater than 25.

The present invention is further directed to a method for making a package having an inner shield. The method includes the steps of: providing a substrate and a plurality of electrical elements, the substrate having a first surface, a side surface, a grounding metal layer and at least one grounding solder pad, the grounding metal layer disposed in the substrate and exposed on the side surface of the substrate, the grounding solder pad disposed in the substrate and exposed on the first surface of the substrate, and electrically connected to the grounding metal layer, the electrical elements disposed on the first surface of the substrate; forming a molding compound on the first surface of the substrate, for encapsulating the electrical elements, the molding compound including a top surface, a bottom surface and a side surface; removing part of the molding compound, for forming at least one groove, the groove disposed between the electrical elements and penetrating the top surface and the bottom surface of the molding compound; filling an inner shield in the groove, the inner shield electrically connected to the grounding solder pad; cutting the substrate and the molding compound; and forming a conformal shield, for covering the molding compound and the side surface of the substrate, and the conformal shield electrically connected to the grounding metal layer and the inner shield.

Therefore, the inner shield enables the electrical elements to have low electromagnetic interference and high electromagnetic compatibility. Moreover, electrical elements with various functions can be integrated into the package of the invention to reduce the number of elements in the product so as to reduce the size of the product.

BRIEF DESCRIPTION OF THE DRAWINGS

FIG. 1 is a cross-sectional view of a conventional package;
FIGS. 2 to 11 are schematic views for illustrating a method for making a package having an inner shield according to a first embodiment of the present invention; and
FIGS. 12 to 24 are schematic views for illustrating a method for making a package having an inner shield according to a second embodiment of the present invention.

DETAILED DESCRIPTION OF THE INVENTION

Figure 5:
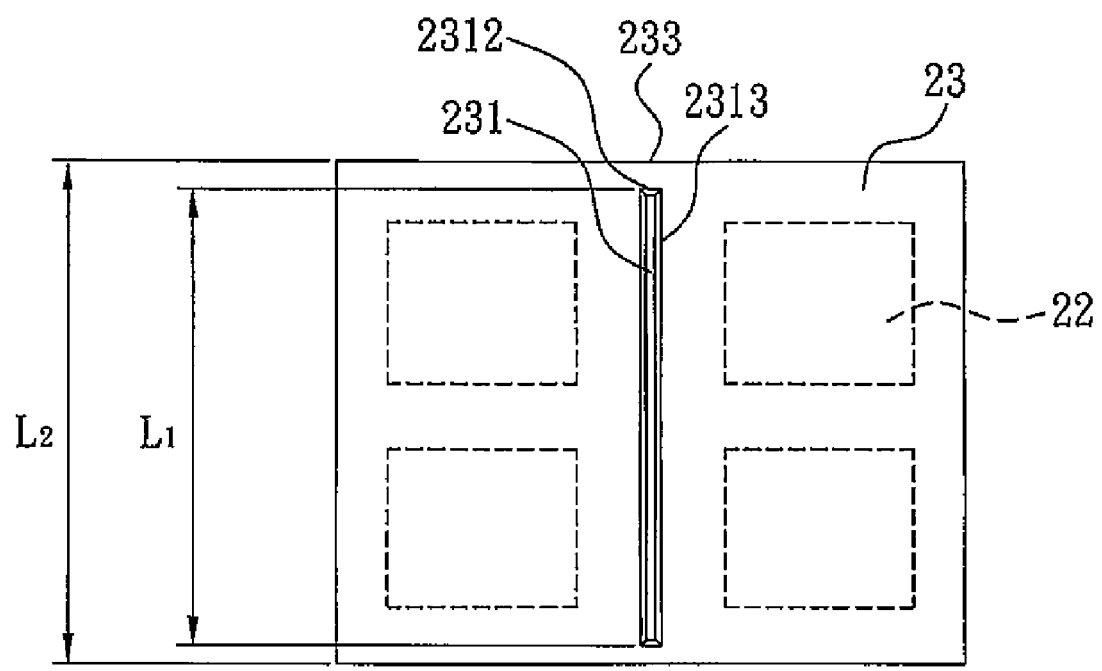

FIGS. 2 to 11 show schematic views for illustrating a method for making a package having an inner shield according to a first embodiment of the present invention. As shown in FIG. 2, a substrate 21 and a plurality of electrical elements 22 are provided. The substrate 21 has a first surface 2111, a side surface 2112, a grounding metal layer 212, at least one grounding solder pad 214, a top grounding metal region 215 and a solder mask layer 213. The grounding metal layer 212 is disposed in the substrate 21 and exposed on the side surface 2112 of the substrate 21. The grounding solder pad 214 is disposed in the substrate 21 and exposed on the first surface 2111 of the substrate 21, and electrically connected to the grounding metal layer 212.

The top grounding metal region 215 is disposed in the substrate 21 and is exposed on the first surface 2111 of the substrate 21. In the embodiment, the top grounding metal region 215 is electrically connected to the grounding metal layer 212. However, in other embodiments, the top grounding metal region 215 may be disposed on the grounding metal layer 212. The solder mask layer 213 is disposed on the first surface 2111 of the substrate 21 and has at least one opening 2131 to expose part of the top grounding metal region 215 so as to form the grounding solder pad 214. In the embodiment, the width $W_1$ of the grounding solder pad 214 is 300 μm. The electrical elements 22 are disposed on the first surface 2111 of the substrate 21. The electrical elements 22 can be active elements or passive elements; in particular, the electrical elements 22 may be digital circuit, analog circuit or active elements formed on the first surface 2111 of the substrate 21 by copper toil.

As shown in FIG. 3, a molding compound 23 is formed on the first surface 2111 of the substrate 21, the molding compound 23 is used for encapsulating the electrical elements 22. The molding compound 23 includes a top surface 232, a bottom surface 234 and a side surface 233. As shown in FIG. 4, part of the molding compound 23 is removed to form at least one groove 231. The groove 231 penetrates the top surface 232 and the bottom surface 234 of the molding compound 23 and is disposed between the electrical elements 22. In the embodiment, part of the grounding solder pad 214 is exposed in the groove 231. The width $W_2$ of the groove 231 is smaller than the width $W_1$ of the grounding metal layer 214, preferably, the width $W_2$ of the groove 231 is between 50 μm and 200 μm, more preferably, the width $W_2$ of the groove 231 is between 100 μm and 200 μm.

Figure 6:
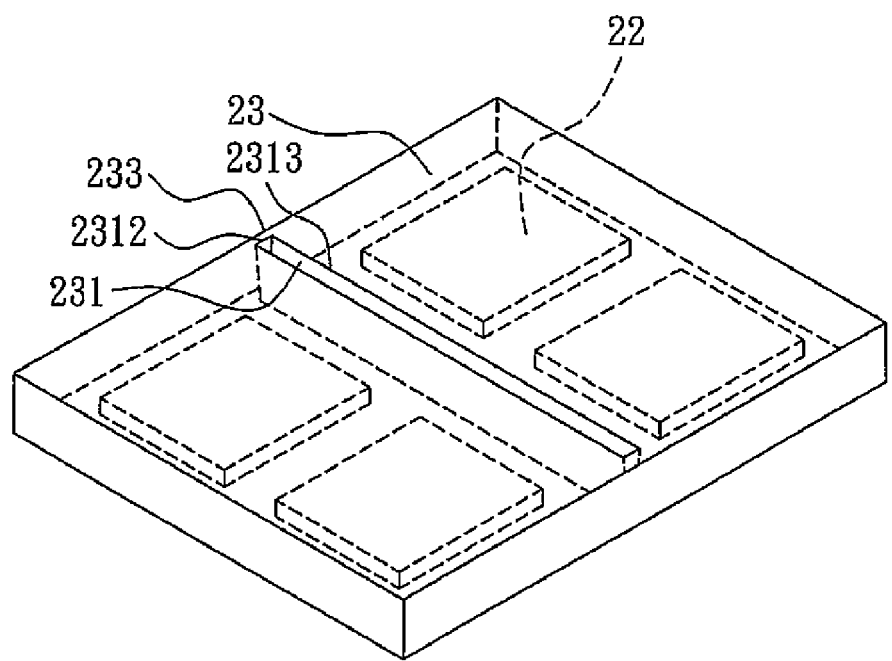
Figure 7:
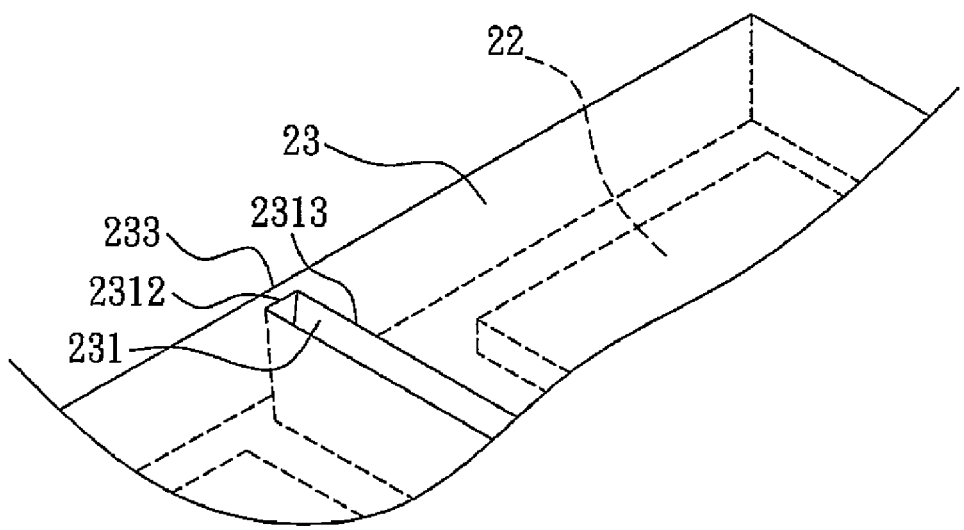
Figure 8:
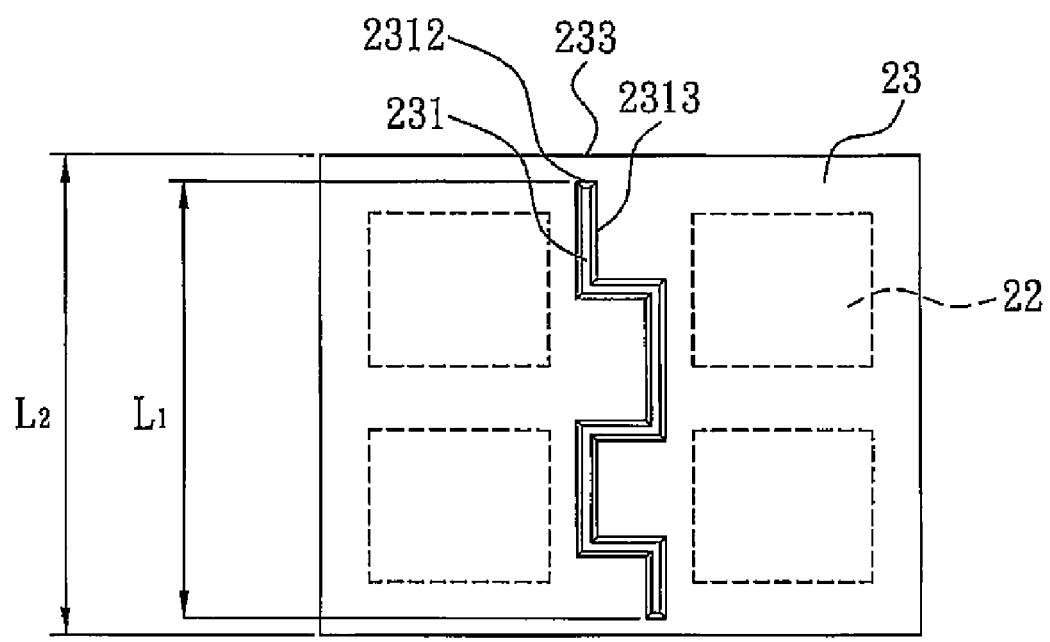

As shown in FIGS. 5 to 7, FIG. 5 is a top view of FIG. 4, FIG. 6 is a perspective view of FIG. 4, FIG. 7 is a local enlarged view of FIG. 6. In the top view, the groove 231 is formed as a straight line shape, and the groove 231 has a long side 2313 and a short side 2312, the long side 2313 connecting to the short side 2312. The length of the short side 2312 is equal to the width $W_2$ of the groove 231, the length $L_1$ of the long side 2313 is smaller than the length $L_2$ of the substrate 21, and larger than the length of the short side 2312. There is a gap between the short side 2312 of the groove 231 and the side surface 233 of the molding compound 23; that is, the groove 231 does not penetrate two side surfaces 233 of the molding compound 23. In the embodiment, the laser method is used to remove part of the molding compound 23 to form the groove 231. In a cross-sectional view, the groove 231 is formed as a trapezoid shape, and the include angle between an oblique side and a vertical line (not shown in the FIGs) is 1.8° to 9°. In other embodiments, in the top view, the groove 231 may be a curved line shape, for example, connected by sections, as shown in FIG. 8.

As shown in FIG. 9, an inner shield 24 is filling in the groove 231, the inner shield 24 is electrically connected to the grounding solder pad 214. In the embodiment, a screen printing method is used to form the inner shield 24, and the inner shield 24 directly contacts the grounding metal pad 214. The material of the inner shield 24 is conductive, for example solder or conductive epoxy. The width $W_2$ of the inner shield 24 is equal to the width $W_2$ of the groove 231; that is, the width $W_2$ of the inner shield 24 is more than 50 μm. According to electromagnet shielding theory, if the frequency of the signal is low (i.e. the wavelength of the signal is large), then the width $W_2$ of the inner shield 24 must be relatively great. For example, if the frequency of the signal is above 1 MHz, the width $W_2$ of the inner shield 24 should be more than 50 μm. Therefore, in the invention, the width $W_2$ of the inner shield 24 is more than 50 μm, and can be used for shielding signals above 1 MHz.

Figure 11:
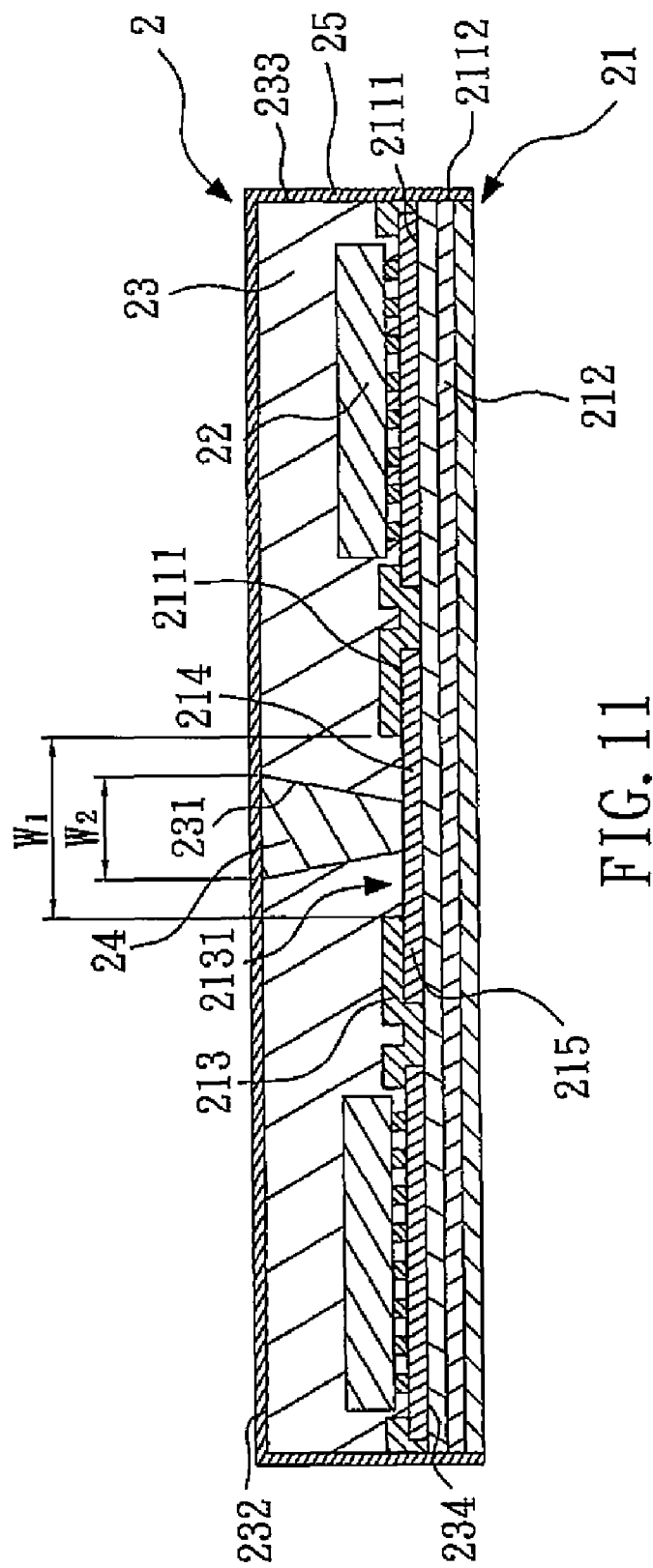

As shown in FIG. 10, the substrate 21 and the molding compound 23 are cut along at least one cutting line L. As shown in FIG. 11, a conformal shield 25 is formed for covering the molding compound 23 and the side surface 2112 of the substrate 21, and the conformal shield 25 is electrically connected to the grounding metal layer 212 and the inner shield 24. Thus, in the invention, the inner shield 24 and the conformal shield 25 are not formed by the plating method at the same time. In the embodiment, the conformal shield 25 is formed by the sputtering method, and the thickness of the conformal shield 25 is 1 μm to 2 μm. The ratio of the thickness of the inner shield 24 to the thickness of the conformal shield 25 is greater than twenty-five. The material of the conformal shield 25 is nickel (Ni). In other embodiments, the conformal shield 25 may be formed by the plating method, and the material of the conformal shield 25 may be copper (Cu). Furthermore, the sputtering method can be used to form an anti-oxidation layer (not shown in the figures) for covering the conformal shield 25. Preferably, the thickness of the anti-oxidation layer is 40 nm, and the material of the anti-oxidation layer is stainless steel. The anti-oxidation layer can prevent oxidization of the conformal shield, thereby raising the yield rate of the product.

Therefore, the inner shield 24 can isolate the electrical elements 22, and enables the electrical elements 22 to have low electromagnetic interference and high electromagnetic compatibility. Also, electrical elements 22 with various functions can be integrated into the package of the invention to reduce the number of elements in the product so as to decrease the size of the product.

Referring to FIG. 11 again, a cross-sectional view of the package is shown having an inner shield according to the first embodiment. The package 2 includes a substrate 21, a plurality of electrical elements 22, a molding compound 23, an inner shield 24 and a conformal shield 25. The substrate 21 has a first surface 2111, a side surface 2112, a grounding metal layer 212, at least one grounding solder pad 214, a top grounding metal region 215 and a solder mask layer 213. The grounding metal layer 212 is disposed in the substrate 21 and exposed on the side surface 2112 of the substrate 21. The grounding solder pad 214 is disposed in the substrate 21 and exposed on the first surface 2111 of the substrate 21, and electrically connected to the grounding metal layer 212.

The top grounding metal region 215 is disposed in the substrate 21 and is exposed on the first surface 2111 of the substrate 21. In the embodiment, the top grounding metal region 215 is electrically connected to the grounding metal layer 212. However, in other embodiments, the top grounding metal region 215 may be disposed on the grounding metal layer 212. The solder mask layer 213 is disposed on the first surface 2111 of the substrate 21 and has at least one opening 2131 to expose part of the top grounding metal region 215 so as to form the grounding solder pad 214. In the embodiment, the width $W_1$ of the grounding solder pad 214 is 300 μm.

The electrical elements 22 are disposed on the first surface 2111 of the substrate 21. The electrical elements 22 can be the active elements or passive elements; in particular, the electrical elements 22 may be digital circuit, analog circuit or active elements formed on the first surface 2111 of the substrate 21 by copper toil. The molding compound 23 is disposed on the first surface 2111 of the substrate 21, and is used for encapsulating the electrical elements 22. The molding compound 23 includes at least one groove 231, a top surface 232, a bottom surface 234 and a side surface 233. The groove 231 penetrates the top surface 232 and the bottom surface 234 of the molding compound 23 and is disposed between the electrical elements 22. In the embodiment, the groove 231 has a long side 2313 and a short side 2312, and there is a gap between the short side 2312 of the groove 231 and the side surface 233 of the molding compound 23, as shown in FIGS. 5 to 7.

The inner shield 24 is disposed in the groove 231, and is electrically connected to the grounding solder pad 214. In the embodiment, the material of the inner shield 24 is conductive, for example solder or conductive epoxy. The width $W_2$ of the inner shield 24 is smaller than the width $W_1$ of the grounding metal layer 214, preferably; the width $W_2$ of the inner shield 24 is between 50 μm and 200 μm; more preferably, the width $W_2$ of the inner shield 24 is between 100 μm and 200 μm.

The conformal shield 25 is used for covering the molding compound 23 and the side surface 2112 of the substrate 21, and the conformal shield 25 is electrically connected to the grounding metal layer 212 and the inner shield 24. In the embodiment, the thickness of the conformal shield 25 is 1 μm to 2 μm. The ratio of the thickness of the inner shield 24 to the thickness of the conformal shield 25 is greater than 25. The material of the conformal shield 25 is nickel (Ni). In other embodiments, the material of the conformal shield 25 may be copper (Cu). Furthermore, the package 2 having an inner shield of the invention further includes an anti-oxidation layer (not shown in the FIGs) for covering the conformal shield 25. Preferably, the thickness of the anti-oxidation layer is 40 nm, and the material of the anti-oxidation layer is stainless steel.

FIGS. 12 to 24 show schematic views illustrating a method for making a package having an inner shield according to a second embodiment of the present invention. The method for making a package having an inner shield according to the second embodiment is substantially the same as the method for making a package having an inner shield according to the first embodiment, and the same elements are designated by the same reference numbers. The difference between the method according to the second embodiment and the method according to the first embodiment is that the step of providing the substrate 21 and the electrical elements 22 further includes a step of forming at least one first solder 26 on the grounding solder pad 214.

Figure 12:
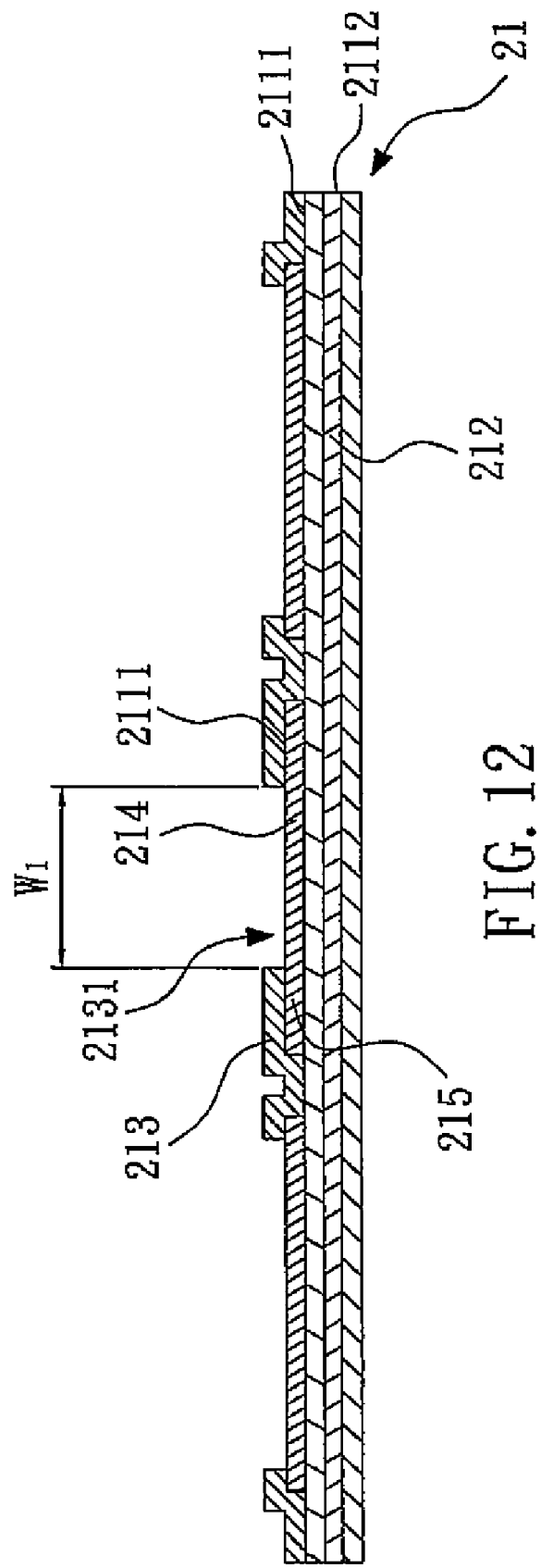
Figure 13:
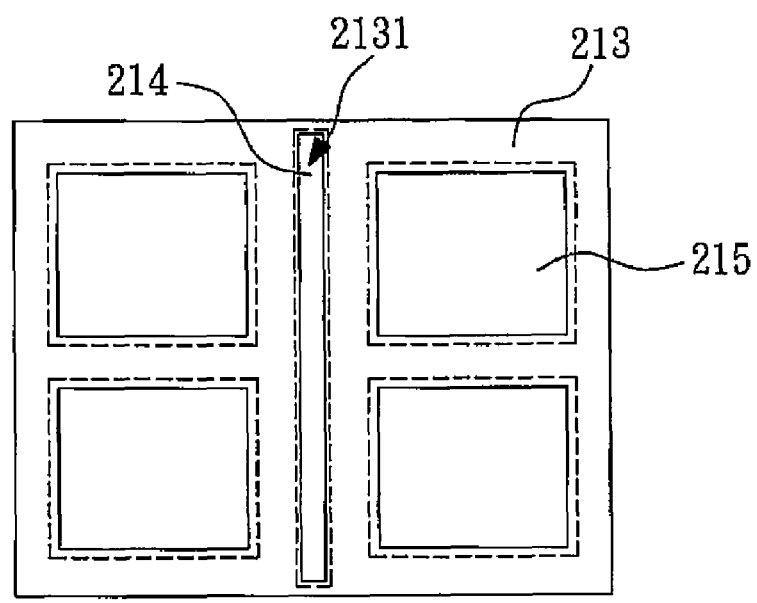
Figure 14:
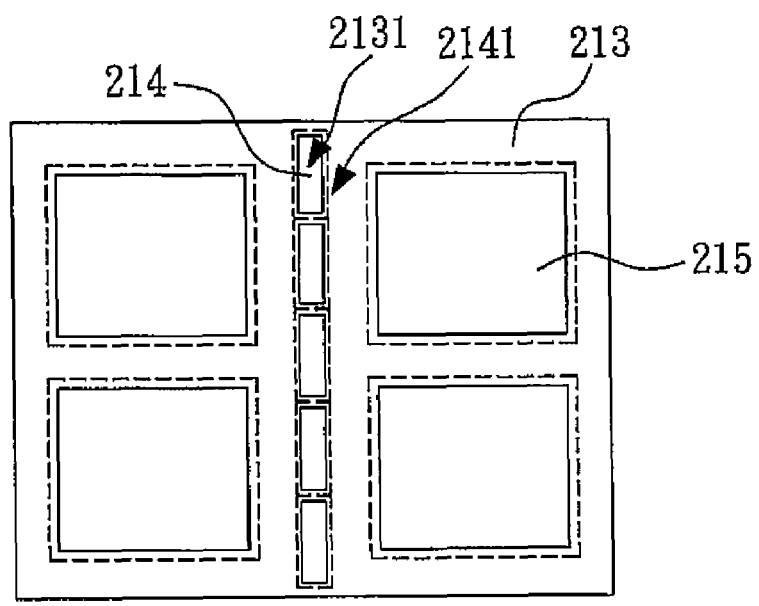

Referring to FIG. 12, the substrate 21 is shown. In the embodiment, the grounding solder pad 214 of the substrate 21 is a continuous square section, and the area of the grounding solder pad 214 is large, as shown in FIG. 13. Therefore, after the first solder 26 and the inner shield 24 are formed on the grounding solder pad 214, the shield area is large to provide better shielding from low electromagnetic interference. However, after the first solder 26 is formed on the grounding solder pad 214, due to the large size of the area of the first solder 26, the protruded thickness of the first solder 26 is uneven after reflowing the first solder 26. In other embodiments, the grounding solder pad 214 includes a plurality of sections 2141, and there is a gap between the two adjacent sections 2141, as shown in FIG. 14. Therefore, the area of the sections 2141 of the grounding solder pad 214 is small, and the protruded thickness of the first solder 26 is even after forming and reflowing the first solder 26.

Referring to FIG. 15, the first solder 26 is formed on the grounding solder pad 214, and the first solder 26 is electrically connected to the inner shield 24. Referring to FIG. 16, the electrical elements 22 are shown. The electrical elements 22 are the active elements, for example chip, and include at least one second solder 27. Then, the first solder 26 and the second solder 27 are reflowed so that the surface of the first solder 26 is formed as a circular arc shape. The second solder 27 is used to mount the electrical elements 22 on the substrate 21. In other embodiments, the electrical elements 22 may be passive elements; when the first solder 26 is formed on the grounding solder pad 214, the second solder 27 is further formed on the top grounding metal region 215.

Figure 17:
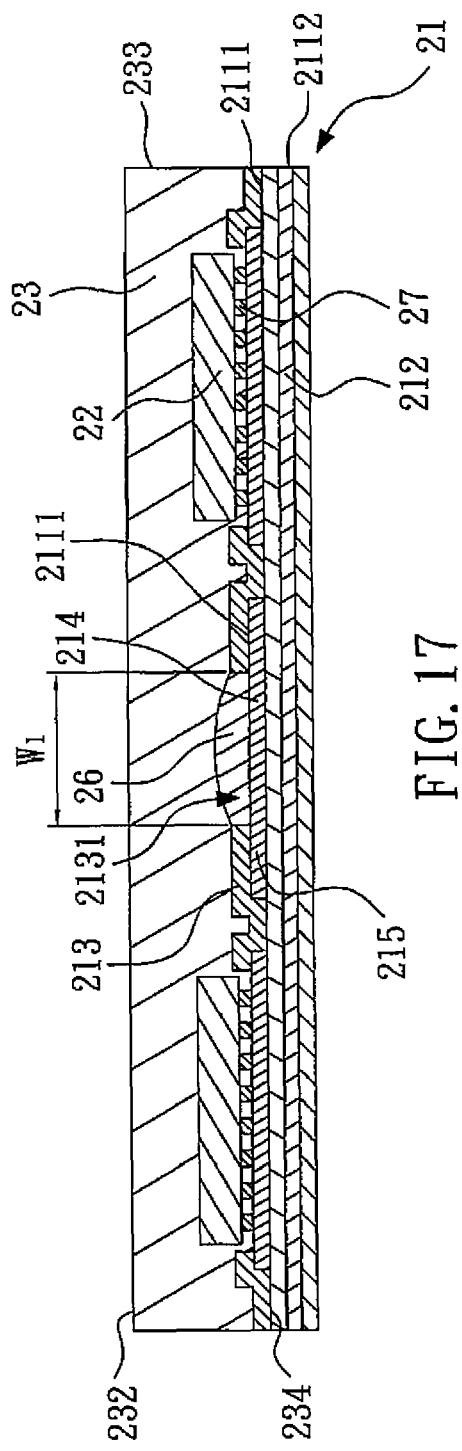
Figure 18:
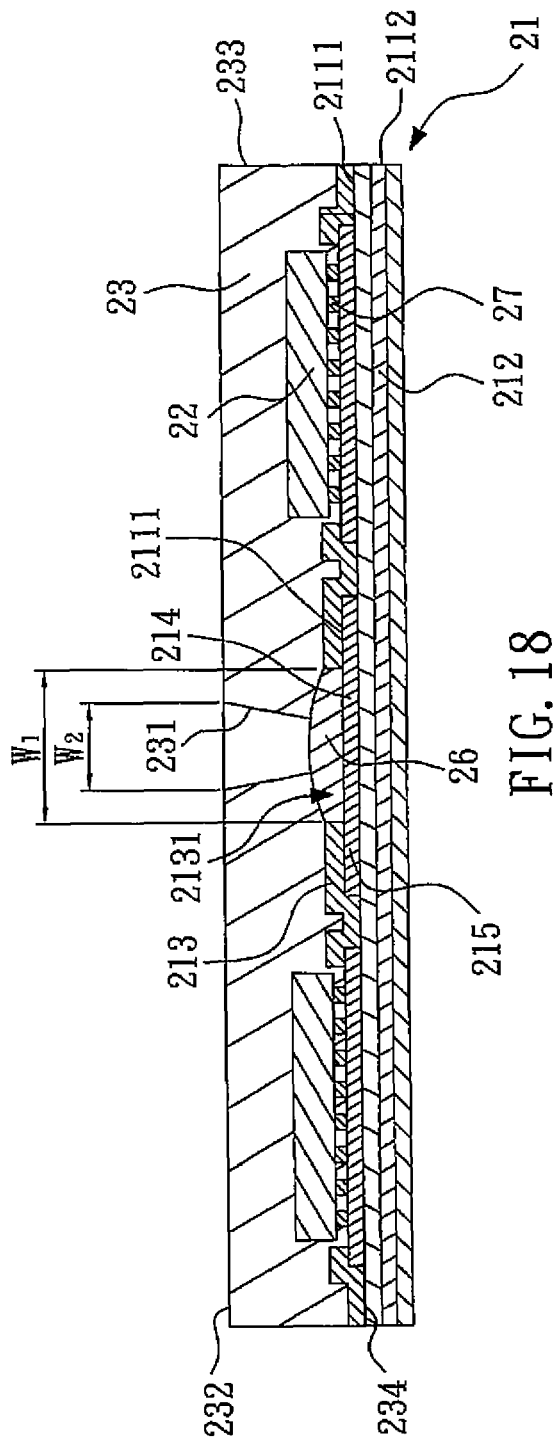
Figure 19:
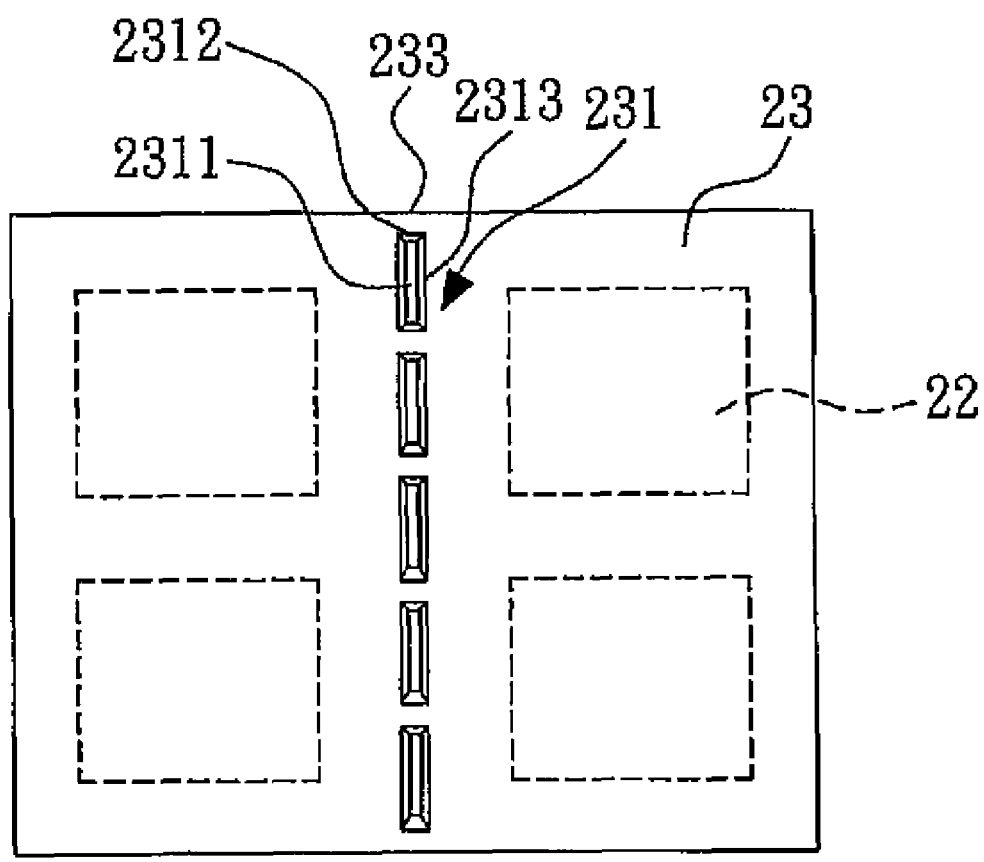
Figure 20:
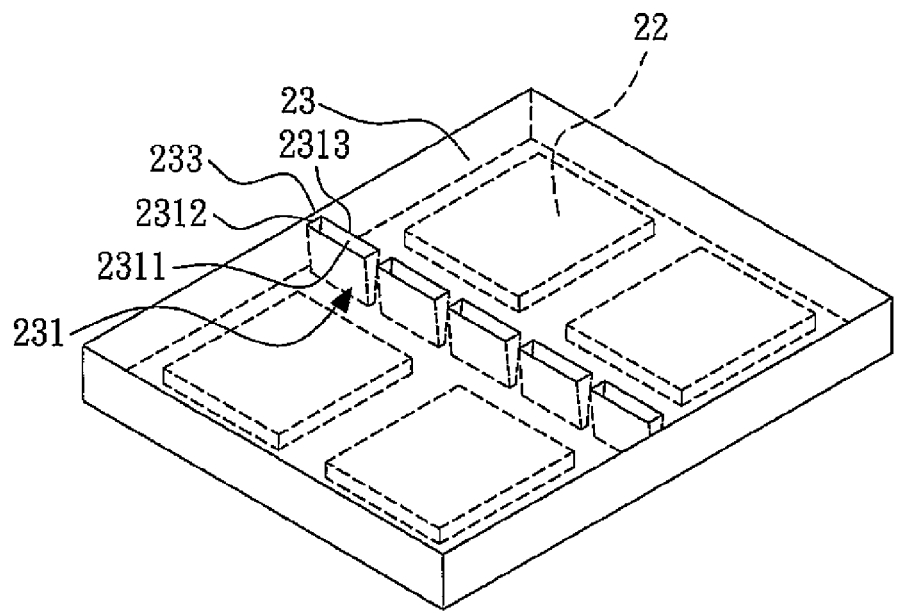
Figure 21:
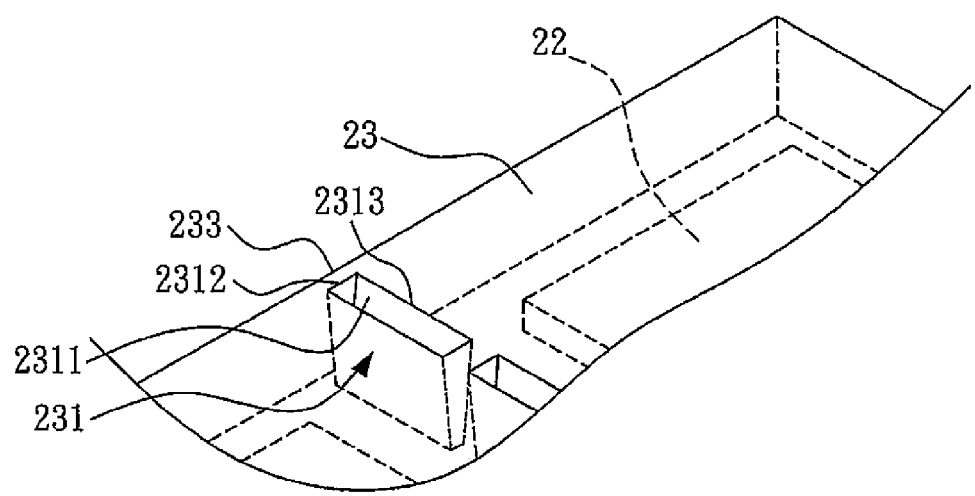
Figure 22:
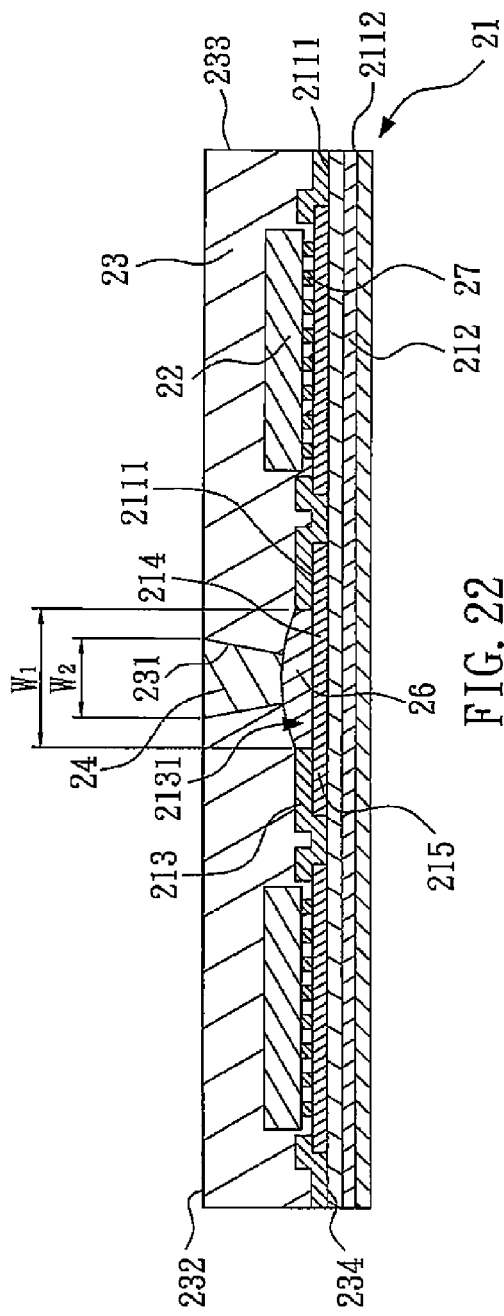
Figure 23:
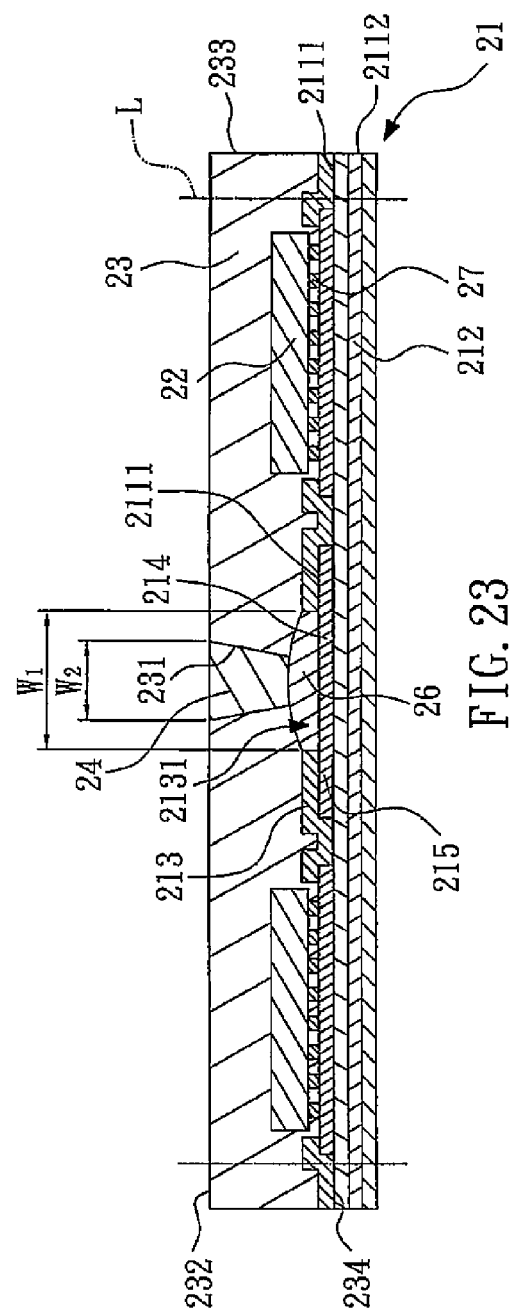
Figure 24:
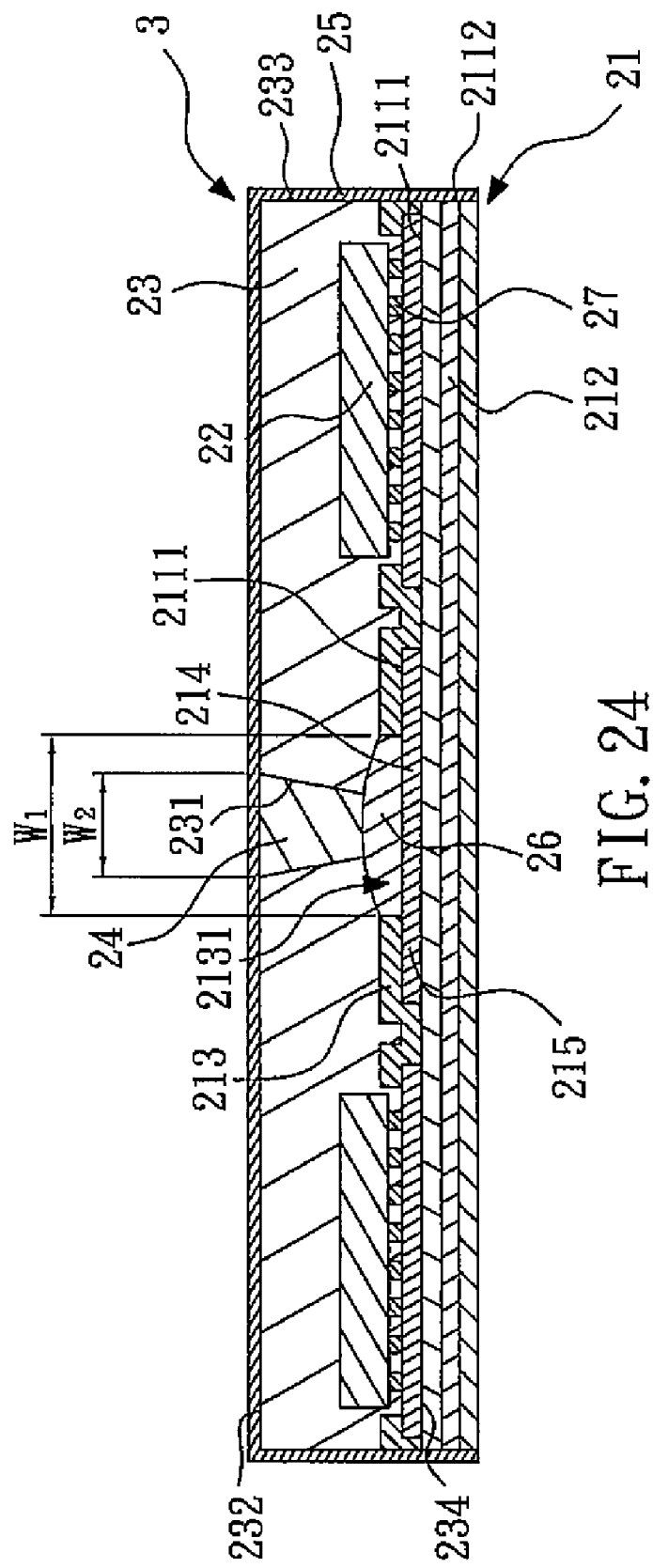

Referring to FIG. 17, the molding compound 23 is formed. Referring to FIG. 18, part of the molding compound 23 is removed to form at least one groove 231, and part of the first solder 26 is exposed in the groove 231. Therefore, when the laser method is used to remove part of the molding compound 23, the first solder 26 can protect the grounding solder pad 214 to avoid damage to the grounding solder pad 214 from the laser. The groove 231 includes a plurality of sections 2311: there is a gap between the two adjacent sections 2311, as shown in FIGS. 19 to 21. Therefore, the length of the sections 2311 of the groove 231 is small so that the inner shield 24 can easily fill into the sections 2311 of the groove 231 to raise the yield rate of the product. Referring to FIG. 22, the inner shield 24 is electrically connected to the grounding solder pad 214 by the first solder 26. Referring to FIG. 23, the substrate 21 and the molding compound 23 are cut along the cutting line L. Referring to FIG. 24, a conformal shield 25 is formed.

Referring to FIG. 24 again, a cross-sectional view of the package is shown having an inner shield according to the second embodiment. The package 3 having an inner shield according to the second embodiment is substantially the same as the package 2 having an inner shield according to the first embodiment, and the same elements are designated by the same reference numbers. The difference between the package 3 according to the second embodiment and the package 2 according to the first embodiment is that the package 3 further includes at least one first solder 26 disposed on the grounding solder pad 214, and the first solder 26 is electrically connected to the inner shield 24. The surface of the first solder 26 is formed as a circular arc shape. Furthermore, the inner shield 24 includes a plurality of sections 241, and there is a gap between the two adjacent sections 241.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A package having an inner shield, comprising:
    a substrate, having a first surface and a side surface, and comprising:
        a grounding metal layer, disposed in the substrate and exposed on the side surface of the substrate; and
        at least one grounding solder pad, disposed in the substrate and exposed on the first surface of the substrate, and electrically connected to the grounding metal layer;
    a plurality of electrical elements, disposed on the first surface of the substrate;
    a molding compound, disposed on the first surface of the substrate and encapsulating the electrical elements, the molding compound comprising at least one groove, a top surface, a bottom surface and a side surface, the groove disposed between the electrical elements and penetrating the top surface and the bottom surface of the molding compound, the groove having a long side and a short side, wherein there is a gap between the short side of the groove and the side surface of the molding compound;

an inner shield, disposed in the groove, and electrically connected to the grounding solder pad; and a conformal shield, covering the molding compound, the inner shield and the side surface of the substrate, and electrically connected to the grounding metal layer and the inner shield.

2. The package as claimed in claim 1, wherein the substrate further comprises a top grounding metal region and a solder mask layer, the top grounding metal region disposed in the substrate and exposed on the first surface of the substrate, the solder mask layer disposed on the first surface of the substrate and having at least one opening to expose part of the top grounding metal region so as to form the grounding solder pad.

3. The package as claimed in claim 1, wherein the long side of the groove is formed as a straight line shape or a curved line shape.

4. The package as claimed in claim 1, wherein the material of the inner shield is solder or conductive epoxy.

5. The package as claimed in claim 1, further comprising an anti-oxidation layer for covering the conformal shield.

6. A package having an inner shield, comprising:

a substrate, having a first surface and a side surface, and comprising:

a grounding metal layer, disposed in the substrate and exposed on the side surface of the substrate; and at least one grounding solder pad, disposed in the substrate and exposed on the first surface of the substrate, and electrically connected to the grounding metal layer;

a plurality of electrical elements, disposed on the first surface of the substrate;

a molding compound, disposed on the first surface of the substrate and encapsulating the electrical elements, the molding compound comprising at least one groove, a top surface, a bottom surface and a side surface, the groove disposed between the electrical elements and penetrating the top surface and the bottom surface of the molding compound;

an inner shield, disposed in the groove, and electrically connected to the grounding solder pad; and a conformal shield, covering the molding compound and the side surface of the substrate, and electrically connected to the grounding metal layer and the inner shield, wherein the ratio of the thickness of the inner shield to the thickness of the conformal shield is greater than 25.

7. The package as claimed in claim 6, wherein the substrate further comprises a top grounding metal region and a solder mask layer, the top grounding metal region disposed in the substrate and exposed on the first surface of the substrate, the solder mask layer disposed on the first surface of the substrate and having at least one opening to expose part of the top grounding metal region so as to form the grounding solder pad.

8. The package as claimed in claim 6, wherein the inner shield comprises a plurality of sections, and wherein there is a gap between the two adjacent sections.

9. The package as claimed in claim 6, further comprising at least one first solder disposed on the grounding solder pad, and electrically connected to the inner shield.

10. The package as claimed in claim 9, wherein the surface of the first solder is formed as a circular arc shape.

* * * * *